US006153846A

United States Patent [19]

Morita et al.

[11] Patent Number: 6,153,846

[45] Date of Patent: Nov. 28, 2000

[54] VACUUM INSULATED SWITCHING APPARATUS

[75] Inventors: Ayumu Morita; Kenichi Natsui; Toru Tanimizu, all of Hitachi, Japan

[73] Assignee: Hitachi, Ltd., Tokyo, Japan

[21] Appl. No.: 09/258,311

[22] Filed: Feb. 26, 1999

[30] Foreign Application Priority Data

Mar. 19, 1998 [JP] Japan .................................. 10-069765

[51] Int. Cl.[7] .......................... H01H 33/66; G01L 21/30; G01R 31/327

[52] U.S. Cl. .......................... 218/122; 218/118; 218/124; 324/424; 324/463

[58] Field of Search .................................... 218/118, 119, 218/120, 121, 122, 134–142, 124, 140; 324/424, 460–463

[56] References Cited

U.S. PATENT DOCUMENTS

| | | | |
|---|---|---|---|
| 3,594,754 | 7/1971 | Voshall | 218/122 X |
| 4,103,291 | 7/1978 | Howe et al. | 218/122 X |
| 4,163,130 | 7/1979 | Kubota et al. | 218/122 |
| 4,672,323 | 6/1987 | Kuhl et al. | 324/460 |
| 5,399,973 | 3/1995 | Kitamura et al. | 324/424 |
| 5,533,382 | 7/1996 | Clerkin | 324/663 X |

FOREIGN PATENT DOCUMENTS

| | | |
|---|---|---|
| 766 277 | 4/1997 | European Pat. Off. . |
| 2002685 | 3/1971 | Germany . |
| 9-153320 | 6/1997 | Japan . |
| 2203282 | 10/1988 | United Kingdom . |

*Primary Examiner*—J. R. Scott
*Attorney, Agent, or Firm*—Mattingly, Stanger & Malur, P.C.

[57] ABSTRACT

A vacuum switch 1 includes a grounded vacuum vessel 2. The reliability of monitoring and measuring the vacuum pressure is improved by providing a vacuum pressure measuring terminal 30 at a side plane of the vacuum vessel 2 such that a main circuit 13 and the measuring terminal 30 are electrically separated from each other.

14 Claims, 15 Drawing Sheets

VACUUM INSULATED SWITCHING APPARATUS

BACKGROUND OF THE INVENTION

The present invention relates to a vacuum insulated switching apparatus provided with a vacuum pressure measuring device.

Switching performance and dielectric strength of a vacuum circuit switch is decreased rapidly when vacuum pressure is increased higher than $10^{-4}$ Torr. Reasons of varying the vacuum pressure include vacuum leakage by generating cracks, release of gaseous molecules adsorbed onto metals and insulating materials, penetration of atmospheric gases, and others. In view of the increasing size of the vacuum vessel in addition to the increasing voltage of the vacuum circuit switch, the release of the adsorbed gas as well as the penetration of atmospheric gas are no longer negligible. In accordance with a structure of the insulated switching apparatus as disclosed in JP-A-9-153320 (1997), wherein a breaker, a disconnector, and a ground switch are integrated in a single bulb, vessel, the addition of a vacuum pressure checking function during operation, or of a continuous pressure monitoring function is desirable, in order to ensure the safety of operators for maintenance and inspection of the load, or of the switching apparatus itself.

Conventionally, vacuum switches provided with vacuum pressure measuring apparatus such as one provided with an ionization vacuum gauge, one in which vacuum pressure is determined by applying a voltage to a small gap provided in the 5 vacuum vessel to cause discharge, one which is provided with a magnetron terminal, and others are known.

SUMMARY OF THE INVENTION

When considering insulation between a main circuit and a ao measuring terminal in the prior art, some problems occur as described below. If the measuring terminal is composed of an insulating cylinder separately from the main circuit, the size of the measuring terminal including the insulating cylinder becomes to the size of the vacuum switch. Furthermore, electrons e generated at the measuring terminal enter into the vacuum switch and collide with the insulating cylinder, that is, in an electron multiplied state by generating secondary electrons. Therefore, deterioration of the insulating performance of the vacuum switch became a problem.

In one example of the prior art, the size of the measuring terminal could be made small by making the insulating cylinder unnecessary by employing a method wherein a power source line and an outer cylindrical electrode of the vacuum pressure measuring element were maintained at an equal potential and a voltage divided with the condenser was applied at an interior electrode of the vacuum pressure measuring element. However, problems were caused including rendering the size of the apparatus large eventually, if the insulation of the condenser with ground was considered, as well as receiving an influence of variation in voltage of the main circuit (for instance, a surge voltage and the like). Because the potential of the measuring element was equal to that of the line at the power source side, insulating transformers and optical transmission were necessary or transmitting signals to relay circuits of the measuring apparatus, the warning lamp, and the warning buzzer. Therefore, there existed a problem that the whole system became complex.

The present invention is aimed at solving the above-mentioned problems, and an object of the present invention is to provide a vacuum insulated switching apparatus provided with a reliable vacuum pressure monitoring and measuring function by providing a vacuum bulb with a grounded vacuum vessel and providing a vacuum pressure measuring apparatus around the vacuum bulb.

The present invention is aimed at achieving this object by providing a grounded vacuum vessel, a switch, which includes a fixed electrode attached to the vacuum vessel via an insulator, and a movable electrode attached to the vacuum vessel via an insulator facing to the fixed electrode, and a vacuum pressure measuring apparatus attached to the vacuum vessel.

The present invention also aims to achieve this object by providing a grounded vacuum vessel, a switch, which includes a fixed electrode attached to the vacuum vessel via an insulator, and a movable electrode attached to the vacuum vessel via an insulator facing to the fixed electrode, a coaxial electrode at a side plane of the vacuum vessel, and a magnetic field generating apparatus arranged around the coaxial electrode.

In addition, the present invention is aims to achieve this object by providing a grounded vacuum vessel, a switch, which includes a fixed electrode attached to the vacuum vessel via an insulator, and a movable electrode attached to the vacuum vessel via an insulator facing to the fixed electrode, a coaxial electrode at a side plane of the vacuum vessel, and a magnetic field generating apparatus is arranged around the coaxial electrode at a time to measure the vacuum pressure.

In accordance with the switching apparatus described above, the main circuit and the measuring element can be separated electrically, and safety of the switching apparatus can be ensured by increasing the reliability of the vacuum monitoring and measuring function.

DETAILED DESCRIPTION OF THE PREFERRED EMBODIMENTS

The preferred embodiments of the present invention are explained in more detail below by referring to FIG. 1 to FIG. 15.

Embodiment 1

Figure 1:
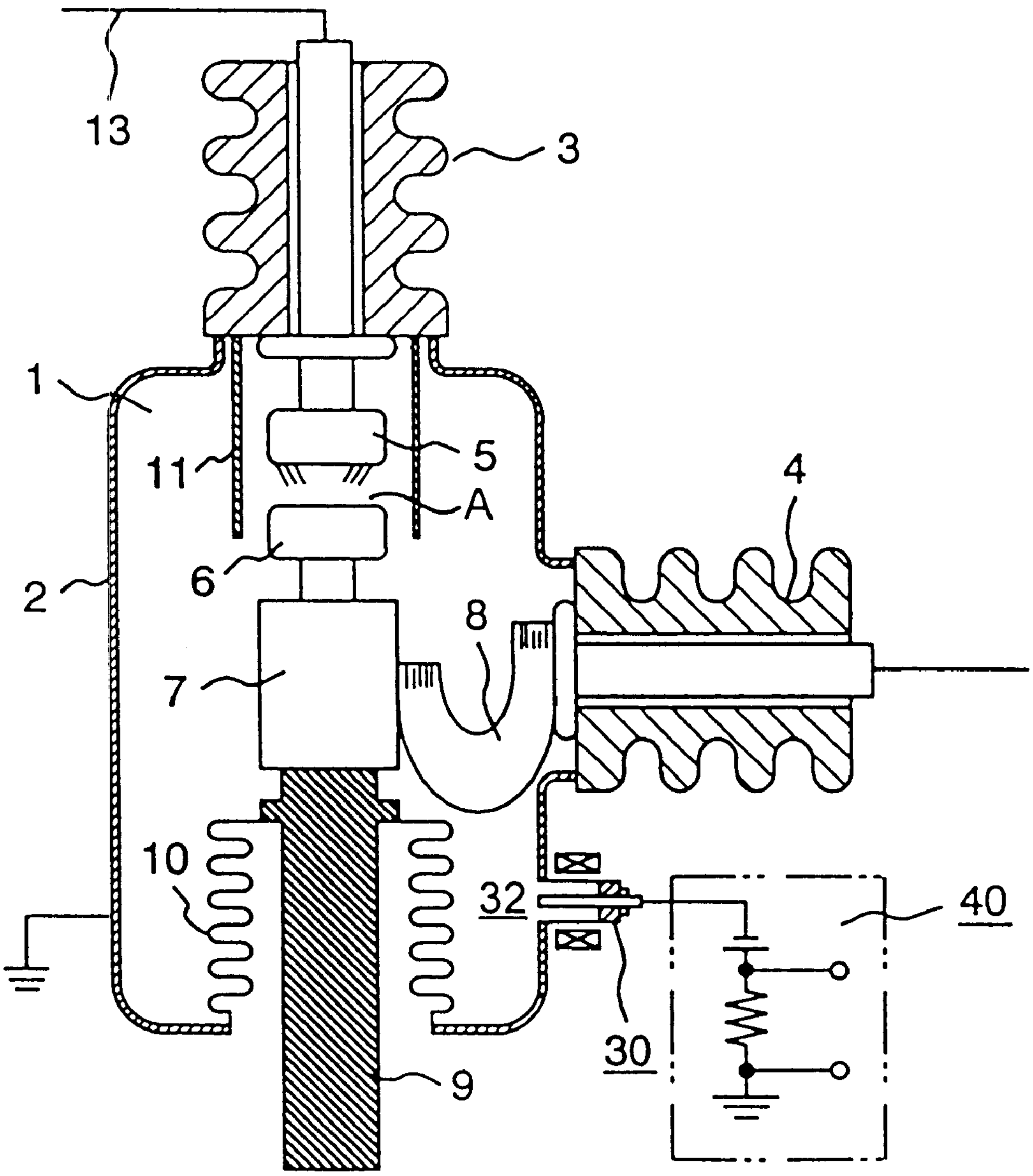
FIG. 1 is a schematic illustration of the vacuum switch and the vacuum pressure measuring terminal of an embodiment of the present invention.

The first embodiment of the present invention is now explained. FIG. 1 illustrates a cross sectional view of a vacuum circuit switch 1 and a vacuum pressure measuring terminal (vacuum pressure measuring device) 30.

The vacuum circuit switch is composed by attaching two bushings 3, 4 to the periphery of a grounded metallic vessel 2. A fixed electrode 5 and a movable electrode 6 are arranged so as to be touchable/separable inside the vacuum circuit switch 1 to switch on or off by making the electrodes touch each other or be separate from each other. The fixed electrode 5 is fixed to the bushing 3, and a flexible conductor 8 extended from the movable electrode 6 is supported by the bushing 4. In accordance with the vacuum circuit switch 1 of the present embodiment, an electric current flows through a path in the order fixed electrode 5 supported by bushing 3—movable electrode 6—and flexible conductor 8—supported by bushing 4. The movable electrode 6 and a ground switch 7 are connected with an insulating rod 9, and the insulating rod 9 is fixed to the metallic vessel 2 via a bellow 10. An arc shield 11 surrounding electrodes 5 and 6 prevents an earth fault generated by touching an arc A to the metallic vessel 2.

Figure 13:
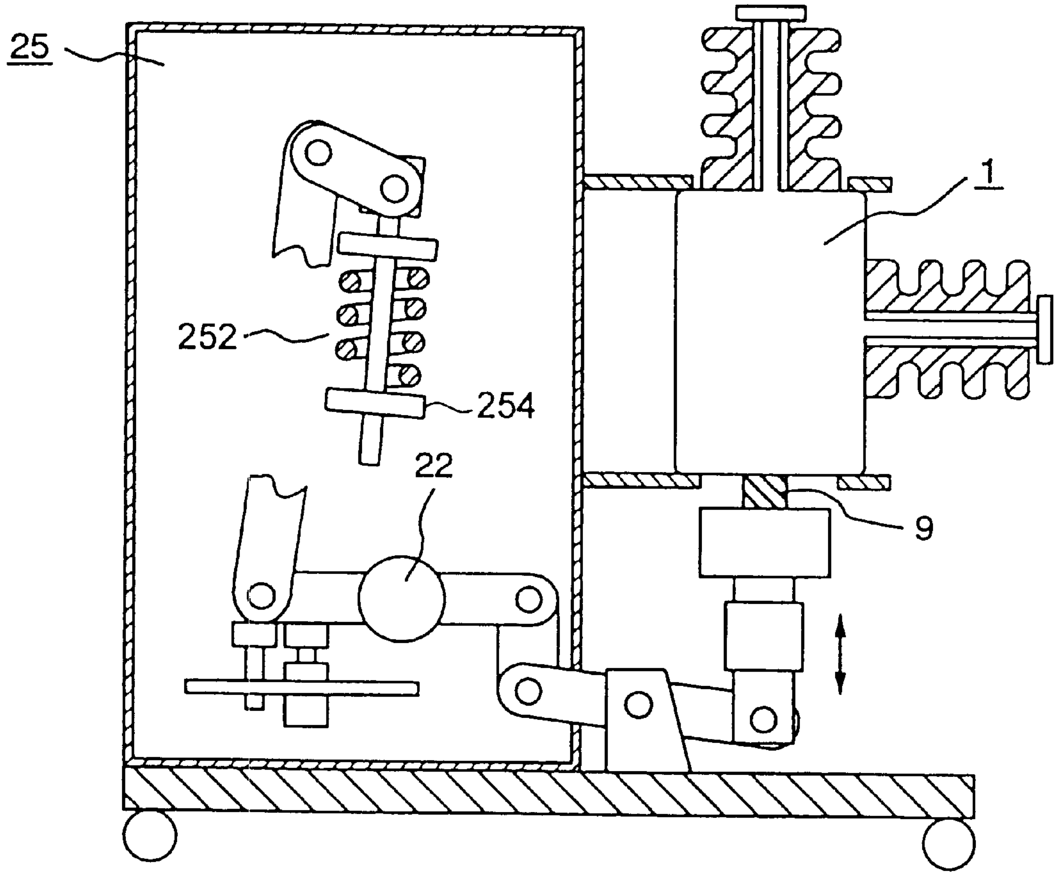
FIG. 13 is a illustration of insulated switching apparatus of an embodiment of the present invention.

As shown in FIG. 13, the vacuum circuit switch 1 is operated by an operating mechanism 25. A disconnecting spring 252, which generates a driving force by releasing a pressed insulating portion 254 by a trip mechanism provided separately, and the driving force is transmitted to the insulating rod 9 via a shaft 22. As the result, the insulating rod 9 is moved upwards or downwards, and the fixed electrode 5 and the movable electrode 6 are contacted or separated.

Figure 3:
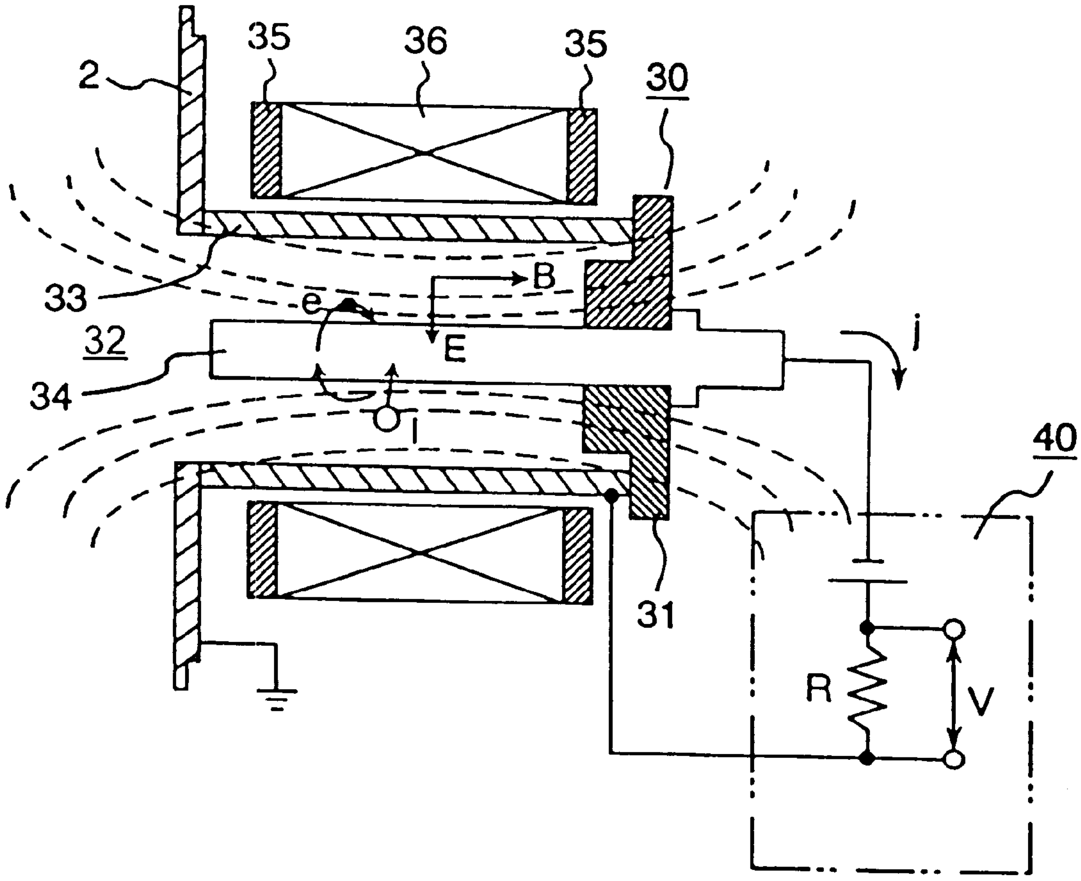
FIG. 3 is a vertical cross section of the vacuum pressure measuring terminal attached to the vacuum switch of an embodiment of the present invention.
Figure 4:
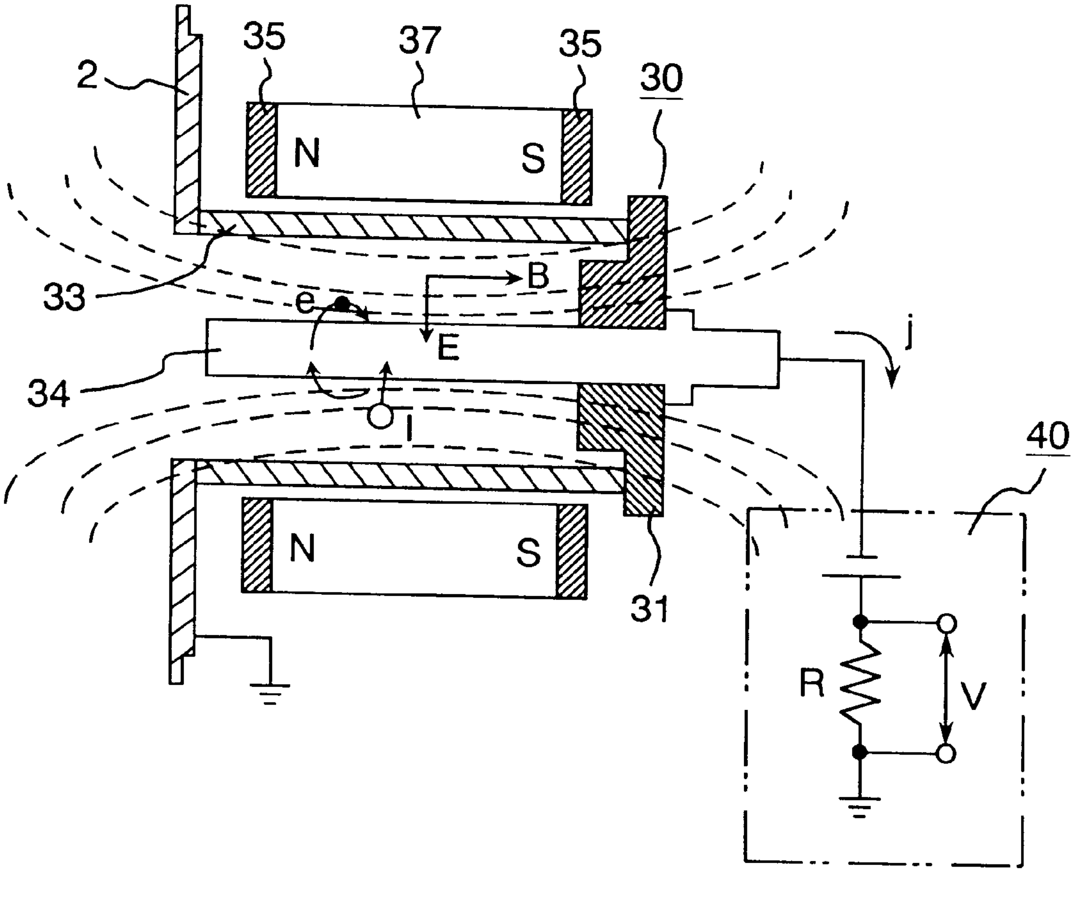
FIG. 4 is a vertical cross section of another vacuum pressure measuring terminal attached to the vacuum switch of an embodiment of the present invention.

A magnetron type measuring terminal 30 is attached at a side plane of the metallic vessel 2 as shown in FIG. 3. The measuring terminal 30 is composed of a coaxial electrode 32 and a coil 36 for generating a magnetic field arranged around periphery of the coaxial electrode 32. The coaxial electrode 32 is composed of a cylindrical outer electrode 33 and an inner electrode 34 penetrating the outer electrode 33. The outer electrode 33 and the inner electrode 34 are insulated from each other by the insulating portion 31. A ring shaped permanent magnet 37 can be used instead of the coil 36 as shown in FIG. 4. Additionally, the N pole and S pole of the magnetic polarity of the permanent magnet 37 can be reversible. The coil 36 and the permanent magnet 37 are mounted on a frame 35, respectively.

Figure 14:
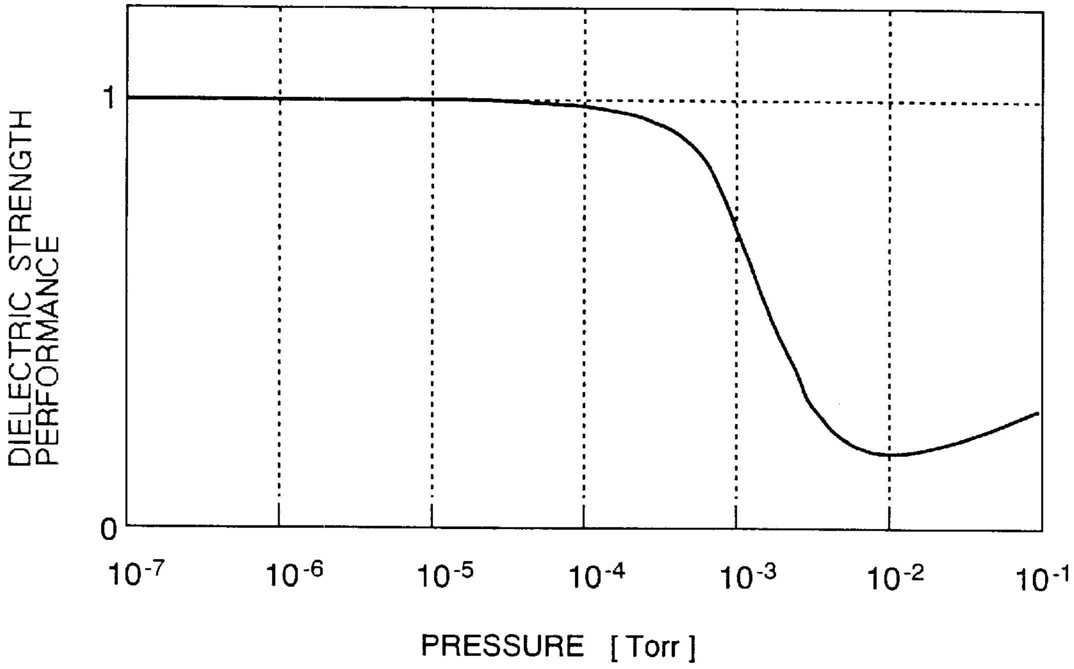
FIG. 14 is a characteristic graph showing a relationship between the pressure P and breaking performance/dielectric strength performance.

A negative direct current is applied to the inner electrode 34 by an electric power source circuit 40 as shown in FIG. 3. An alternating current, or voltage pulses also can be used. The electrons e released from the inner electrode 34 receive Lorentz force by a magnetic field B applied by an electric field E and the coil 36, and move rotationally around the periphery of the inner electrode 34. The rotating electrons e collide with residual gases to ionize them, and generated anions I which flow into the inner electrode 34. The ionized current j varies depending on the amount of the residual gases, that is, a pressure. Therefore, the pressure can be measured by determining the voltage V generated between both ends of the resistance R. When the pressure must be monitored continuously, a relay may be operated to turn on a warning lamp, or to generate a warning sound based on the voltage at both ends of the resistance R. As shown in FIG. 14, the disconnecting performance and the insulating performance of the vacuum circuit switch 1 rapidly deteriorates when the pressure is increased to $10^{-4}$ Torr or more. The vacuum pressure measuring terminal 30 shone in the present embodiment is detectable until approximately $10^{-6}$ Torr, and is sufficiently effective for monitoring the vacuum pressure.

As the measuring terminal 30 is provided to the grounded metallic vessel 2, the power source circuit for the measuring terminal 30 can be separated from the main circuit 13. Therefore, malfunction caused by a surge from the main circuit 13 can be avoided, and reliability of the switching apparatus is improved. Because signals are transmitted directly from the resistance R to measuring instruments or relay circuits, the measuring system can be made small in size and simplified. In accordance with the present invention, the measuring terminal 30 is fixed directly to the metallic vessel 2. The number of electrons entering into the vacuum circuit switch 1 is low in comparison with the prior art, wherein the measuring terminal was fixed via an insulating cylinder. Therefore, it is possible to avoid deterioration of the disconnecting performance and the insulating performance of the vacuum bulb circuit switch 1 can be realized according to the present invention.

Figure 5:
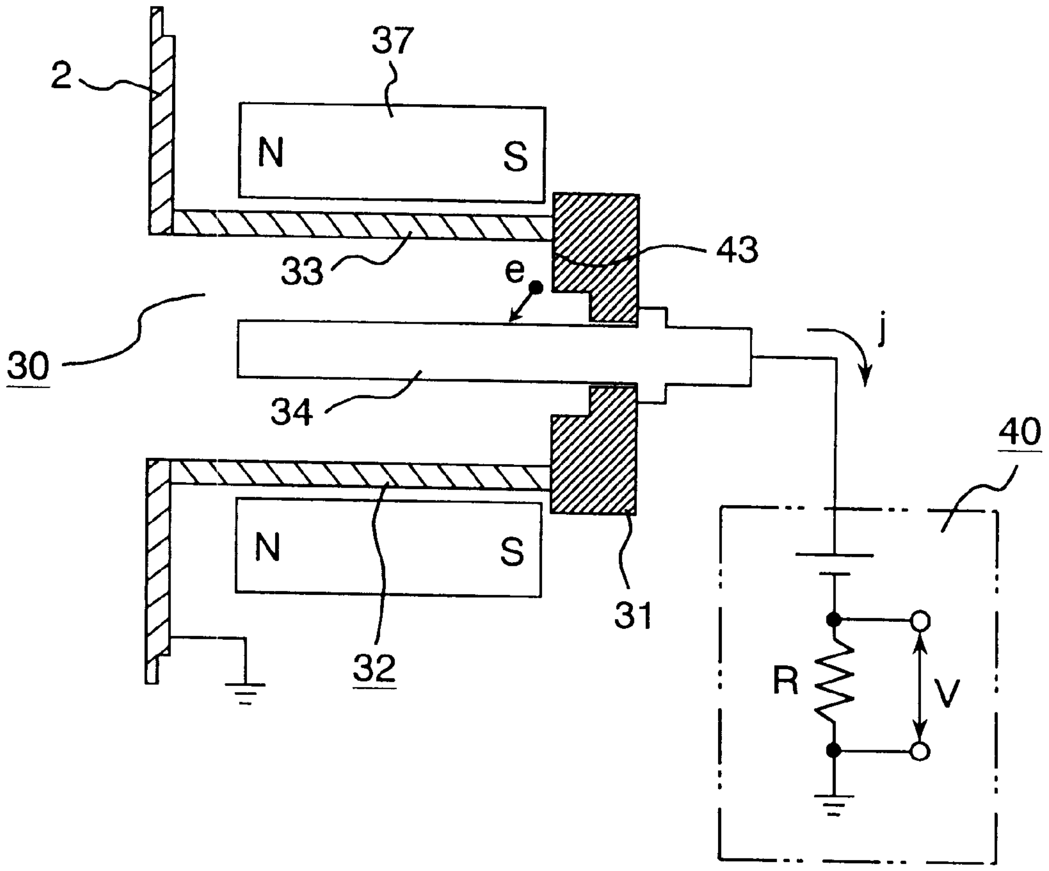
FIG. 5 is a vertical cross section of the vacuum switch of an embodiment of the present invention.

FIG. 5 shows an example of a magnetron using the metallized part of ceramics to release electrons. The outer electrode 33 of the coaxial electrode 32 is connected to a negative polarity, and the inner electrode 34 is connected to a positive polarity. Therefore, the polarity is the opposite of FIG. 4. The electric field becomes high near the thin metallized part 43 of the insulating portion 1 which can be ceramics for connecting the outer electrode 33 with ceramics 31, and therefore, the electron emission coefficient becomes large. As a result, the sensitivity of the magnetron is improved.

Figure 6:
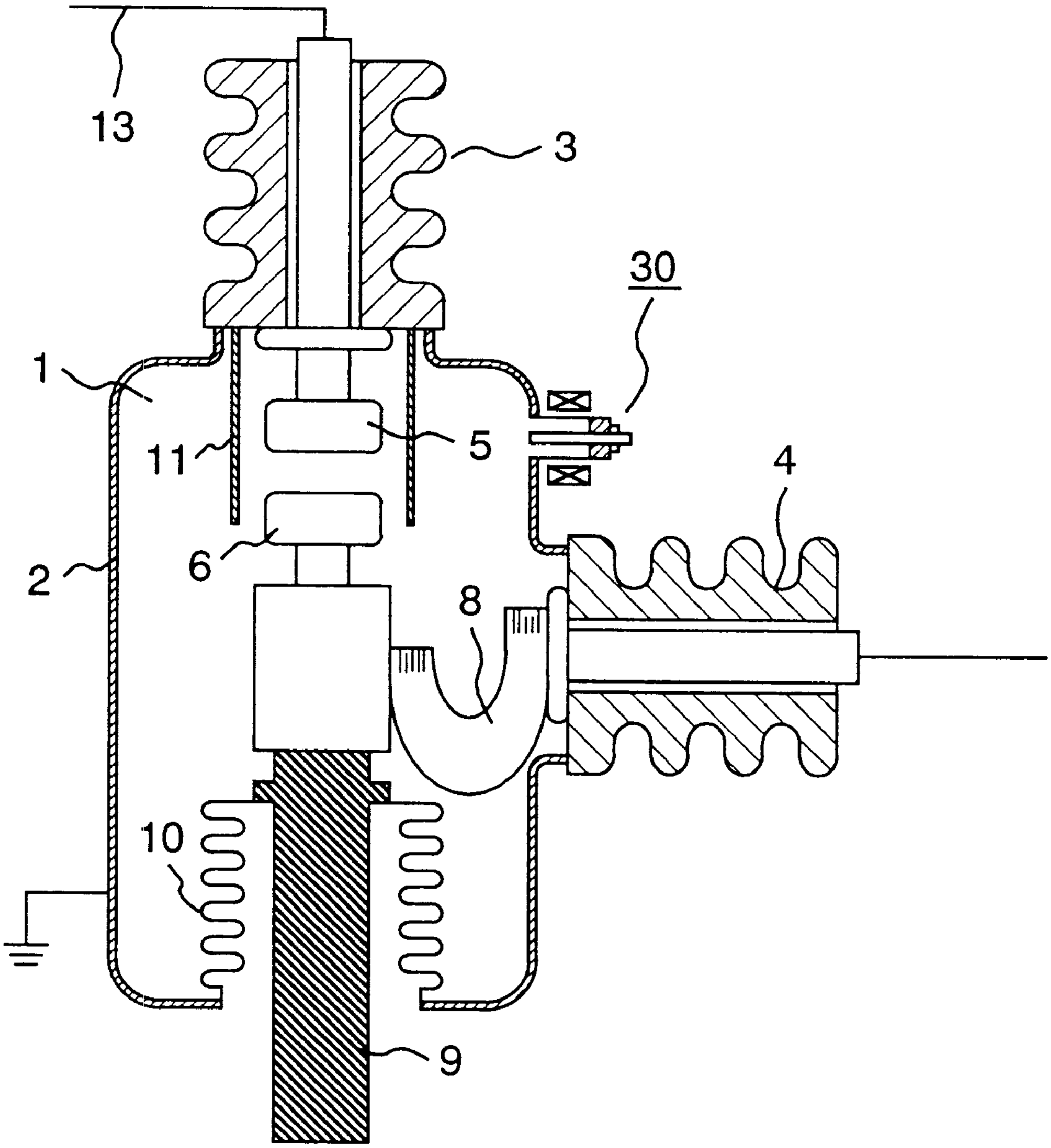
FIG. 6 is a vertical cross section of the vacuum switch of an embodiment of the present invention.
Figure 7:
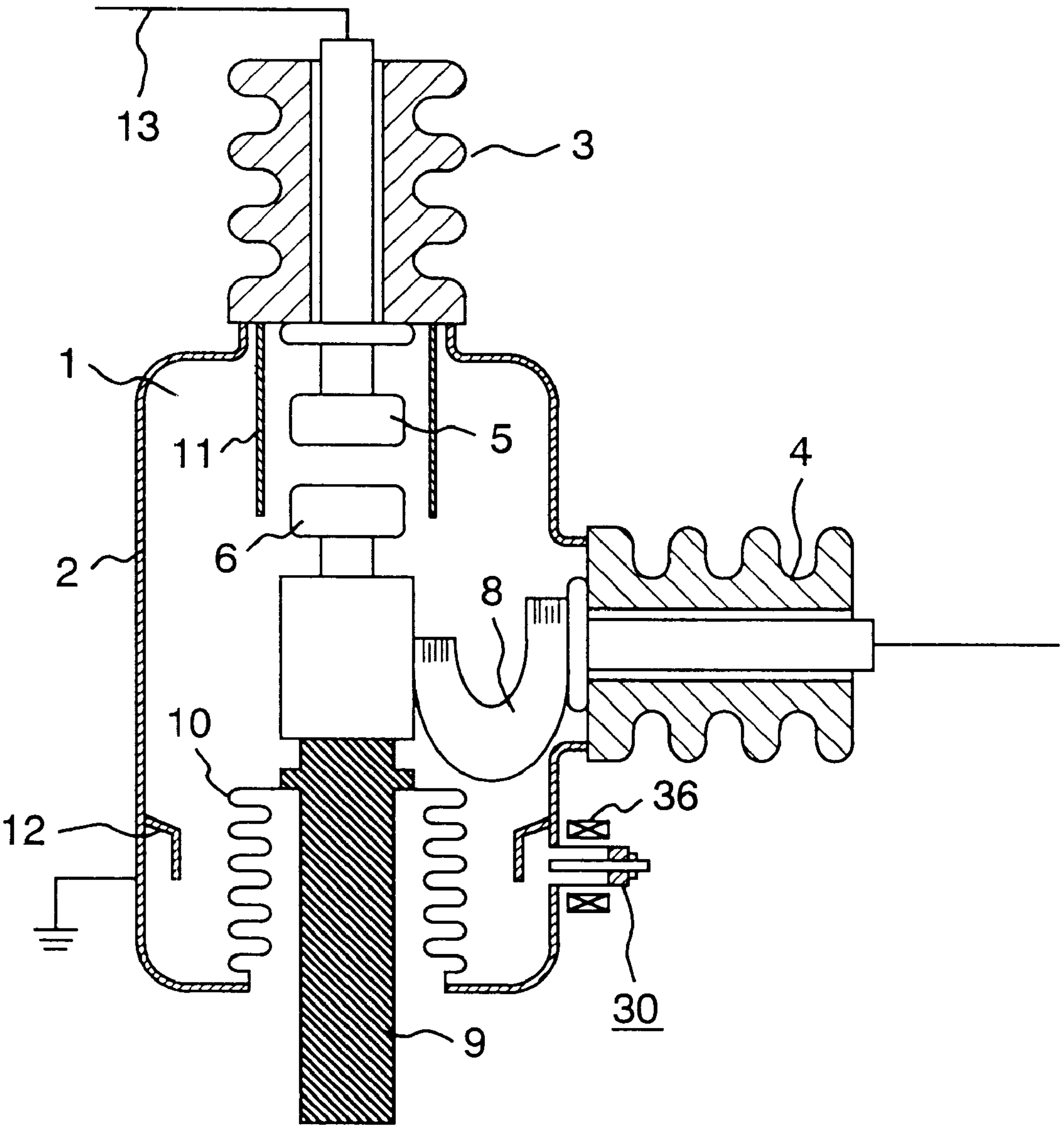
FIG. 7 is a vertical cross section of the vacuum switch of an embodiment of the present invention.

The position for fixing the measuring terminal 30 is preferably outside of the arc shield 11 as shown in FIG. 6. Because metallic particles, electrons, and ions released from the electrode at a disconnecting time do not enter into the measuring terminal 30, the reliability can be maintained. A shield 12 can be provided separately in the vacuum circuit switch 1 as shown in FIG. 7. In this case, the coil 36 can be arranged far from the electrode, and reduction of the disconnecting performance by the magnetic field can be avoided. The coil 36 is not necessarily provided at all times, but may be provided at only the pressure measuring time, in order to avoid the influence of the magnetic field to the disconnecting performance.

It is natural that the present invention is applicable not only to the magnetron terminal, but also to measuring terminals such as ionization vacuum gauge terminal, discharging gap measuring terminal, and the like. The reliability of all the measuring terminal can be improved by attaching to the grounded metallic vessel 2, because the measuring system and the main circuit can be separated.

Embodiment 2

Figure 2:
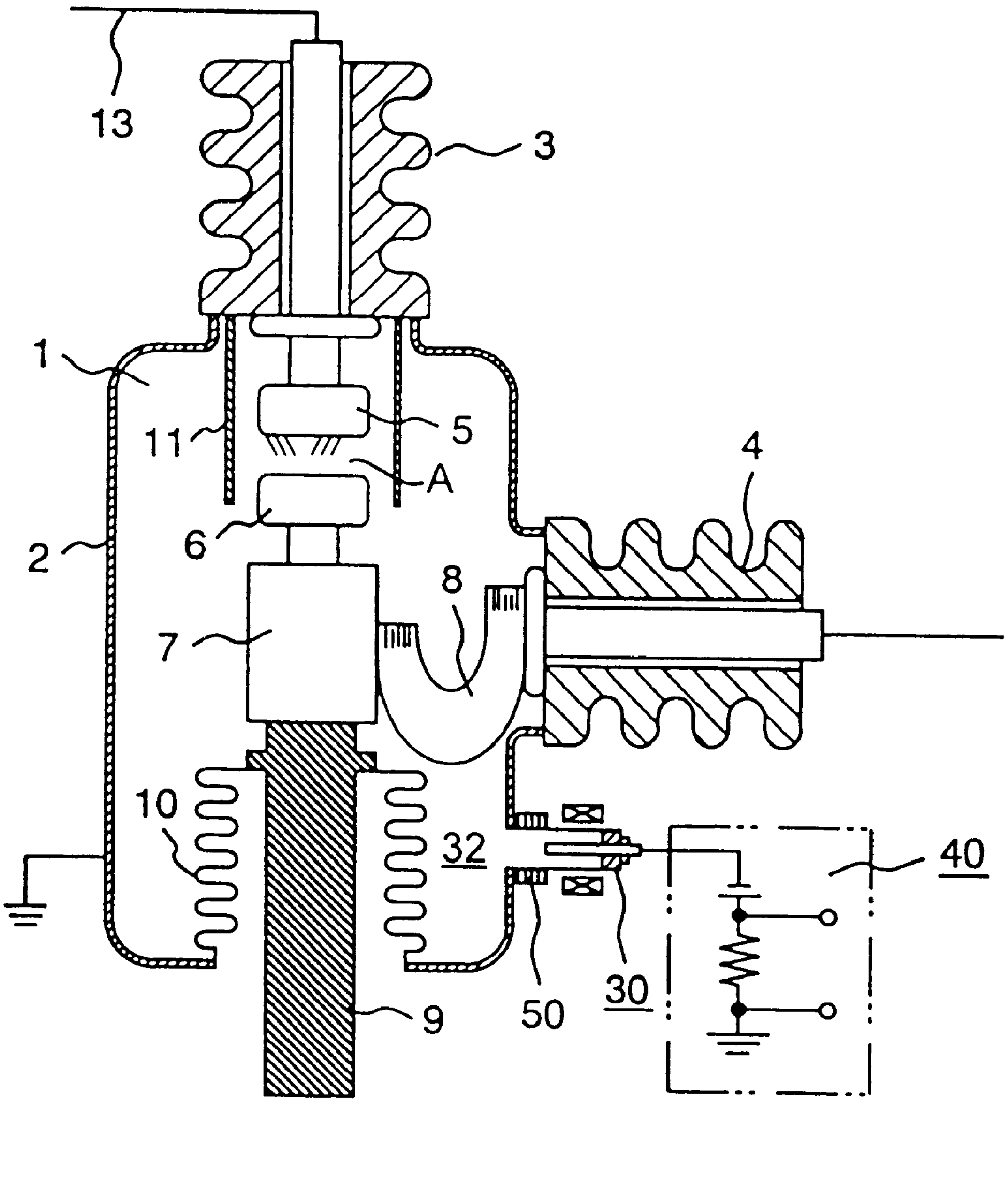
FIG.2 is a schematic illustration of the vacuum switch and the vacuum pressure measuring terminal of an embodiment of the present invention.

The second embodiment of the present invention is described by referring to FIG. 2. In accordance with the present embodiment, the measuring terminal 30 shown in FIG. 1 is attached to the metallic vessel 2 of the vacuum circuit switch 1 through an insulating member 50. If the thickness of the insulating member 50, electrons from the sensor repetitively collide with the insulating member 50 and electrons multiplied by the secondary electron multiplication enter into the vacuum circuit switch 1. As a result, the insulation performance is reduced. Therefore, the appropriate thickness of the insulating member 50 is 2 to 3 mm.

Figure 15:
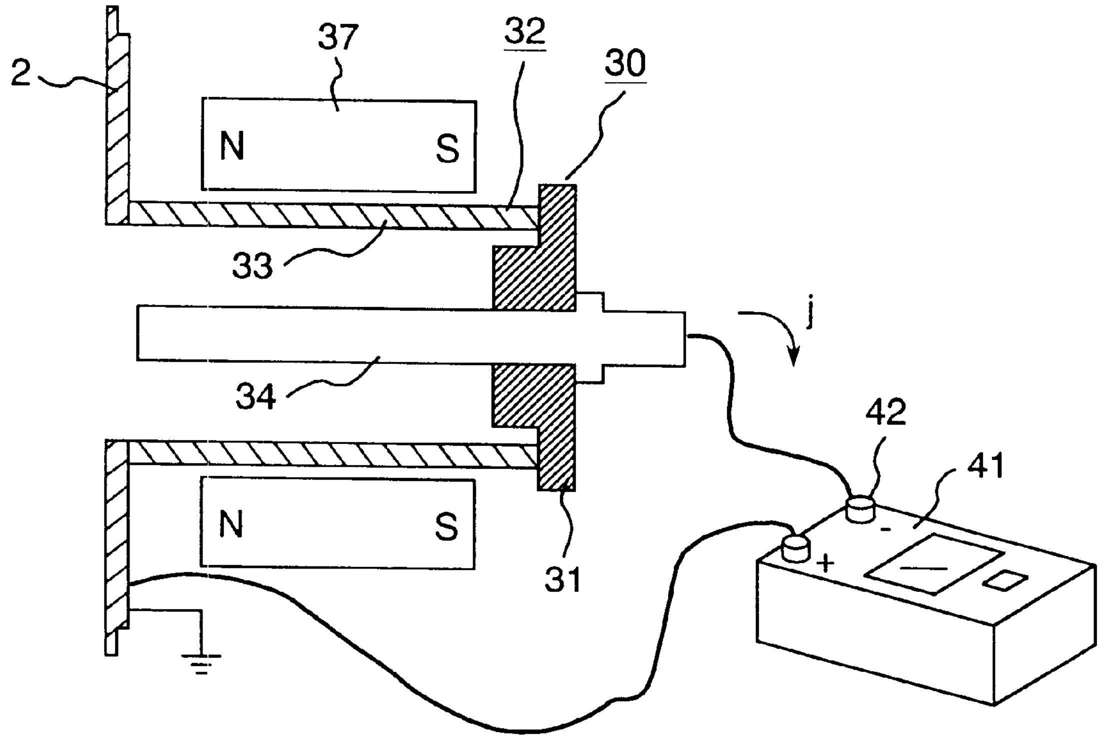
FIG. 15 is a schematic illustration showing a method for measuring the vacuum pressure of another embodiment of the present invention.

According to the present embodiment, the main circuit 13 and measuring system are separated, and therefore, it is possible to avoid failure of the measuring system caused by the surge current from the main body. The vacuum measuring apparatus can be equipped at the wall of the grounded vacuum vessel (metallic vessel) 2 as well as any place distant from the vacuum vessel 2 as shown in FIG. 15. In other words, it is possible to install the vacuum measuring apparatus at anywhere in the vacuum vessel 1 if the pressures can be measured.

Embodiment 3

Figure 8:
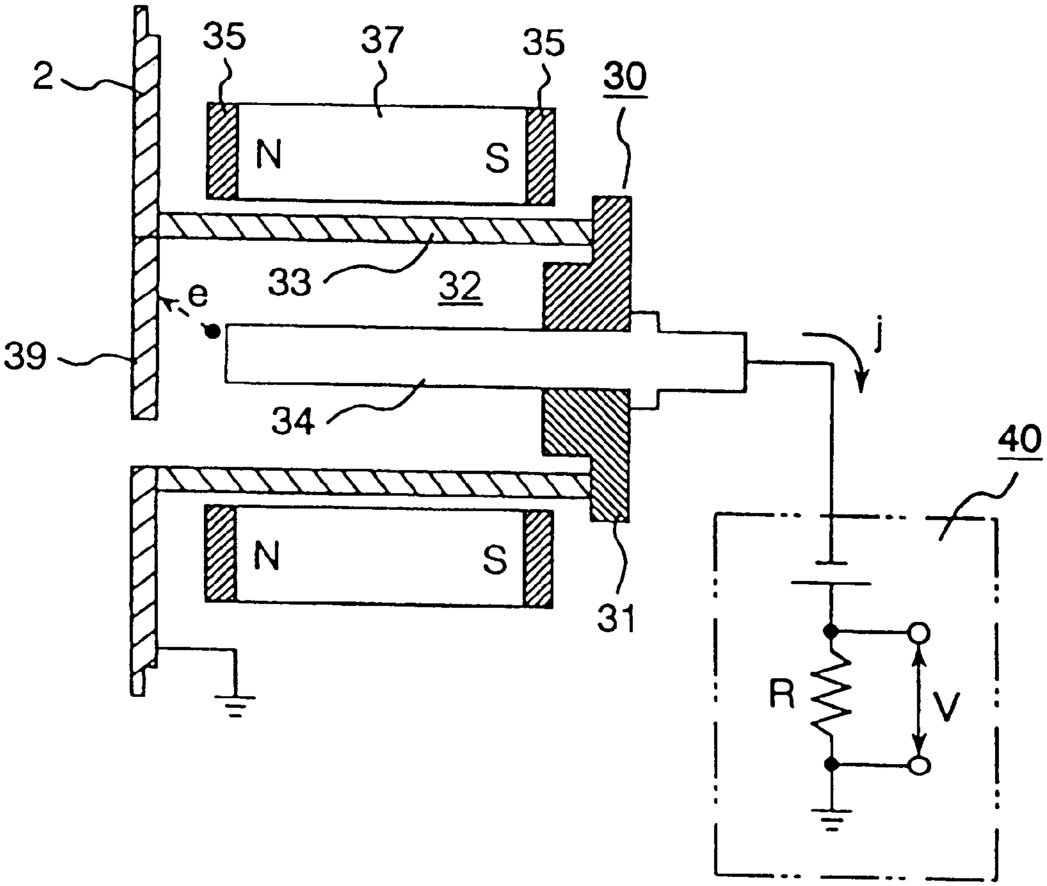
FIG. 8 is a vertical cross section of another vacuum pressure measuring terminal attached to the vacuum switch of an embodiment of the present invention.
Figure 9:
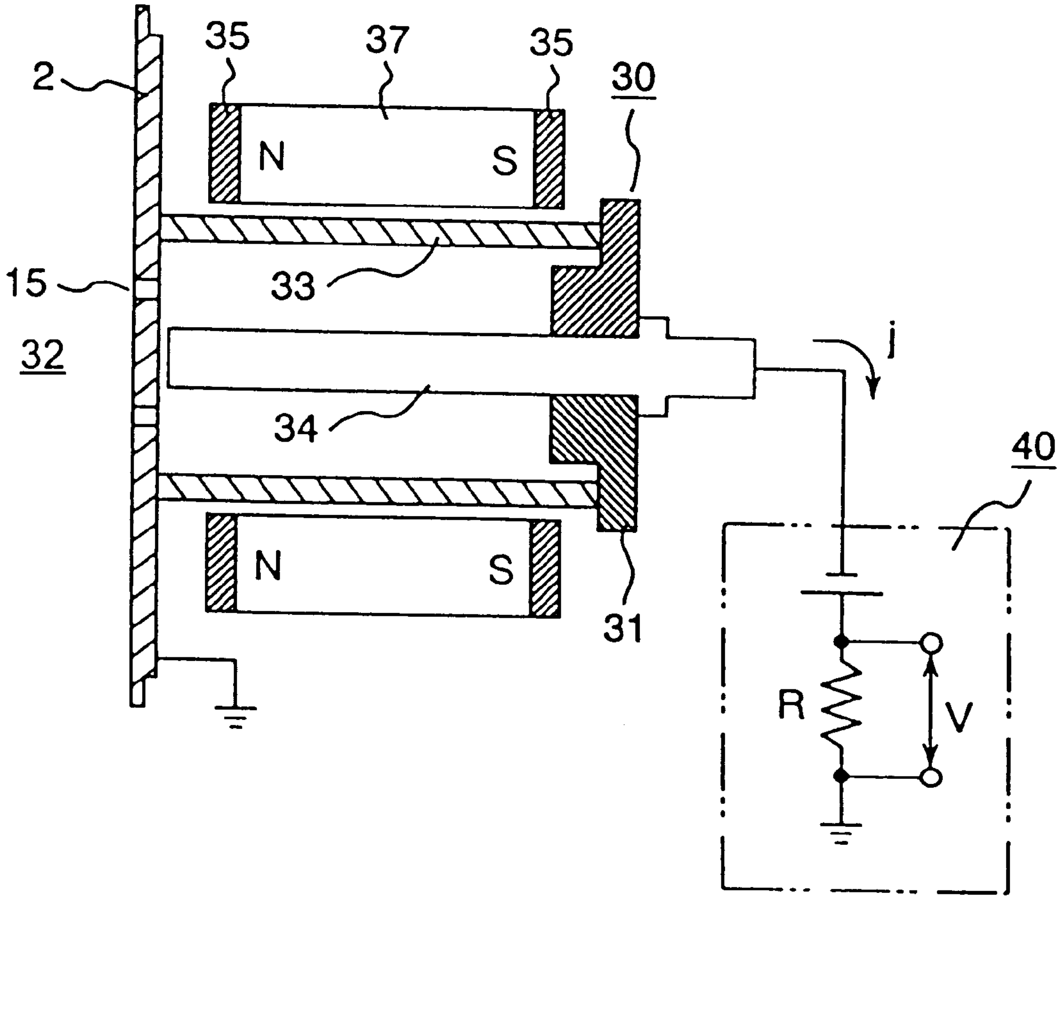
FIG. 9 is a vertical cross section of another vacuum pressure measuring terminal attached to the vacuum switch of an embodiment of the present invention.

The third embodiment of the present invention is described by referring to FIG. 8. In accordance with the present embodiment, the measuring terminal 30 shown in FIG. 8 is attached to the metallic vessel 2 in the vacuum circuit switch 1 shown in FIG. 1. The measuring terminal 30 is composed of an outer electrode 33, an inner electrode 34, and a third electrode 39 having an equal potential to the outer electrode 33 which is provided facing the inner electrode 34. Accordingly, the electrons released from a top end of the inner electrode 34 are captured by the electrode 39, the electrons e entering into the inside of the vacuum circuit switch can be decreased, and decrease of the insulating performance of the vacuum circuit switch 1 can be avoided. The same effect as above can be obtained by providing a hole 15 to the metallic vessel 2, and attaching the coaxial electrode 32 thereon as shown in FIG. 9.

Figure 10:
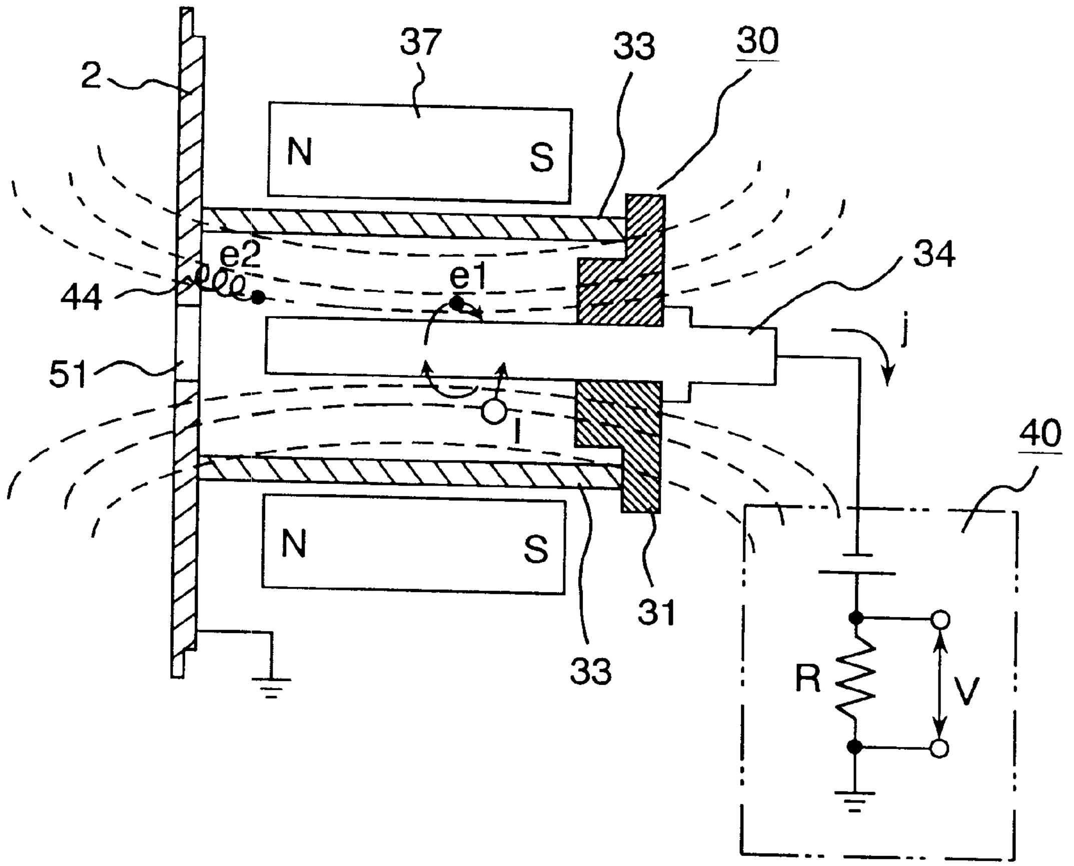
FIG. 10 is a vertical cross section of another vacuum pressure measuring terminal attached to the vacuum switch of an embodiment of the present invention.

As shown in FIG. 10, a hole 51 smaller than the inside of outer electrode 33 is provided at the metallic vessel 2. The electrons e2 emitted from the top end of the inner electrode 34 receive Lorentz force by the electric field E and magnetic field B, and move along a spiral locus 44 and reach the metallic vessel 2. When the electron e2 repetitively collide with residual gases, an ion current j flows. In addition to the current caused by the electron e1, the sensitivity is improved by the effect of electrons e2.

Embodiment 4

Figure 11:
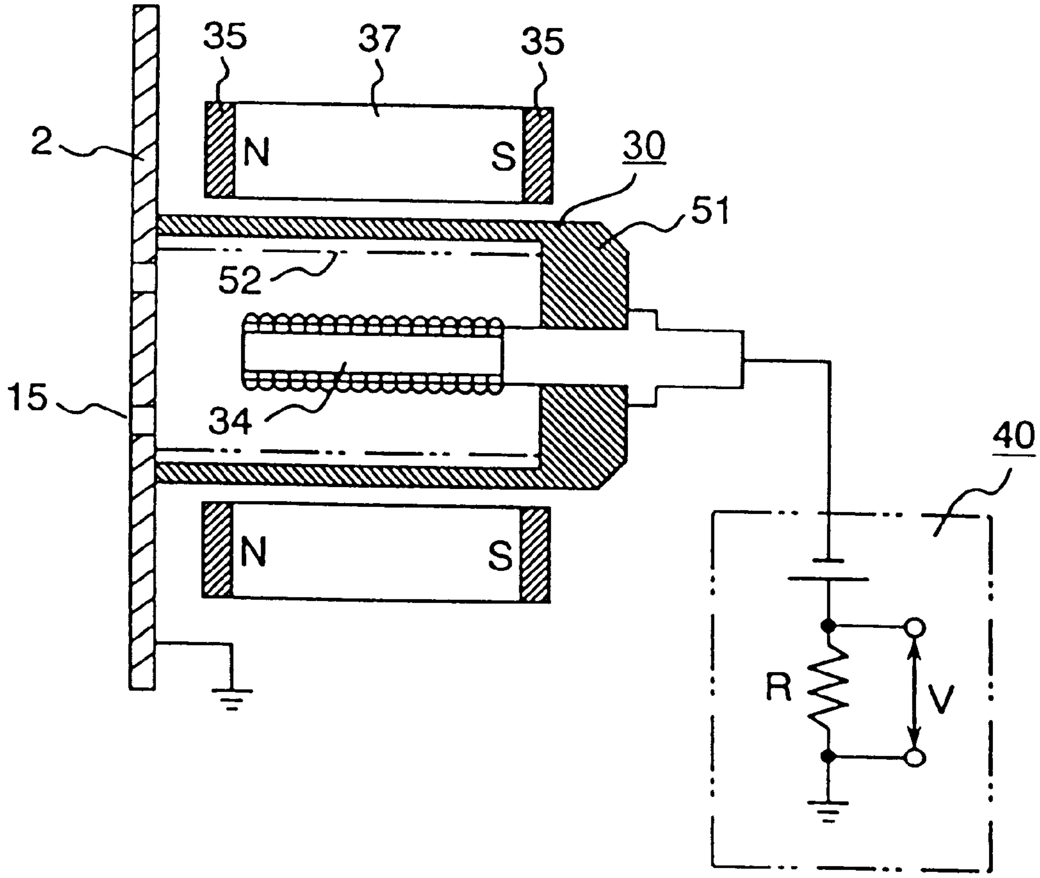
FIG. 11 is a vertical cross section showing another embodiment of the present invention.

The fourth embodiment of the present invention is explained described by referring to FIG. 11. In accordance with the present embodiment, the measuring terminal 30 shown in FIG. 11 is attached to the metallic vessel 2 in the vacuum circuit switch 1 shown in FIG. 1. The measuring terminal 30 comprises an outer electrode composed of a metallic plated film 52 on the inner side plane of cup shaped ceramic body 51. In accordance with embodiments 1 and 2 as shown in FIG. 3, the insulating portion 31 and the outer electrode 33 are manufactured separately. However, in accordance with the present embodiment, the insulating portion 31 and the outer electrode 33 can be manufactured as an integrated member. Therefore, the numbers of parts and brazing portions can be reduced.

Embodiment 5

The fifth embodiment of the present invention is described hereinafter. In accordance with the present embodiment shown in FIG. 11, the measuring terminal 30 shown in FIG. 11 is attached to the metallic vessel 2 in the vacuum circuit switch 1 shown in FIG. 1. The measuring terminal 30 comprises the inner electrode 34 having a screw portion, which improves the sensitivity of the measurement by enhancing a local electric field at the surface of the inner electrode 34 to increase the amount of electrons released from the inner electrode 34. Naturally, the same effect as above can be obtained by providing any protrusion at the inner electrode 34.

Embodiment 6

The sixth embodiment of the present invention is described by referring to FIG. 15. The measuring terminal 30 is attached at the side plane of the metallic vessel 2 as same in embodiment 1 shown in FIG. 1. In accordance with the present embodiment, the generation of a direct current voltage applied to the measuring terminal 30 and measurement of the ionic current are performed using a megohmmeter 41, i.e. an insulation resistance tester. The megohmmeter 41 is a convenient tester for measuring M level resistance by applying a direct current voltage of several kV to an insulator and measuring a leak current, and is one of many instruments, which are generally owned by personal in charge of the maintenance and control of high voltage apparatus. Voltage terminals 42 of the megohmmeter 41 are connected with the coaxial electrode 32 of the measuring terminal 30, and a resistance R is measured by applying a voltage V. The leaking current (I=V/R) determined by the voltage V and the resistance R corresponds to the ionic current I depending on the pressure P. Accordingly, if a relationship between the resistance R and the pressure P is determined previously, the pressure can be readily measured with the megohmmeter.

It is not necessary to prepare a special electric power source for measuring pressure, and the pressure can be readily measured with a low cost.

Embodiment 7

The seventh embodiment of the present invention is explained hereinafter. The present embodiment is a countermeasure for prevent the magnetic field B generated at the measuring terminal 30 from entering into the vacuum circuit switch 1. The composition is as same as the embodiment 1 shown in FIG. 1. In accordance with the present embodiment, the metallic vessel 2 shown in FIG. 1 is made of a magnetic material such as Monel (a Cu—Ni alloy) and the like, in order to avoid decrease of disconnecting performance with entering a magnetic field by shielding the magnetic field generated at the measuring terminal 30 with the metallic vessel 2.

Figure 12:
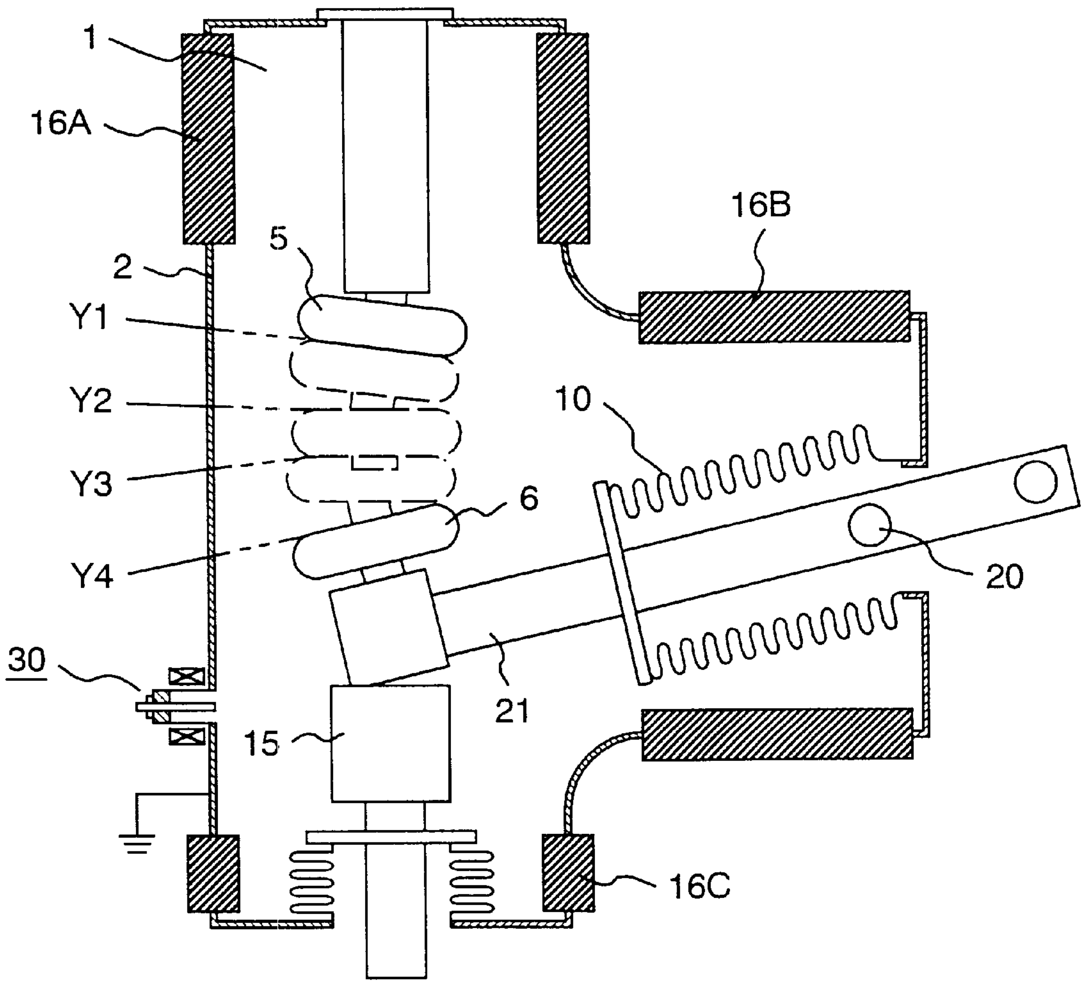
FIG. 12 is a vertical cross section showing another embodiment of the present invention.

The present invention can be applied to a rotary operation type vacuum circuit switch shown in FIG. 12. The movable electrode 6 is rotated with a main axis 20 as a supporting point to be contacted or separated with the fixed electrode 5. The fixed electrode 5 is insulated by an insulating cylinder 16A, and the movable electrode 6 is insulated by an insulating cylinder 16B, from the grounded metallic vessel 2, respectively. In accordance with the present embodiment, a ground switch 7 is added in order to compose a small size switching apparatus comprising a breaker, a disconnector, and ground switch, by making the movable electrode 6 stop at each of four positions, i.e. a closing position Y1, an opening position Y2, a disconnected position Y3, of which insulating is not broken with thunder and the like, and grounding position Y4. In accordance with adding the vacuum pressure measuring terminal 30 of the present invention to the vacuum circuit switch 1 having a function as a disconnector, safety of operators for maintenance and inspection can be ensured, and the reliability of the switching apparatus can be improved.

As explained above, in accordance with the present invention, reliability in monitoring and measuring the vacuum pressure is improved by providing the vacuum pressure measuring terminal to the Grounded metallic vessel, and as the result, a vacuum insulated switching apparatus having a high safety can be provided.

What is claimed is:

1. A vacuum insulated switching apparatus comprising:

a grounded vacuum vessel, a fixed electrode connected to a main circuit and disposed in said vacuum vessel via an insulator, a movable electrode, facing said fixed electrode connected to said main circuit and disposed in said vacuum vessel via an insulator, and a vacuum pressure measuring apparatus, attached to said vacuum vessel for measuring the pressure in said vacuum vessel, wherein said measuring apparatus detects an ion current generated in a portion of said measuring apparatus, which is communicated with vacuum of said vacuum vessel.

2. A vacuum insulated switching apparatus as claimed in claim 1, wherein said vacuum pressure measuring apparatus is capable of detecting a pressure in the range of from $10^{-4}$ to $10^{-6}$ Torr.

3. A vacuum insulated switching apparatus comprising:

a grounded vacuum vessel, a fixed electrode connected to a main circuit and disposed in said vacuum vessel via an insulator, a movable electrode, facing said fixed electrode connected to said main circuit and disposed in said vacuum vessel via an insulator, and a vacuum pressure measuring terminal which comprises a coaxial electrode having an inner electrode and an outer electrode surrounding said inner electrode and a magnetic field generating apparatus arranged around said outer electrode, said coaxial electrode having a portion between said inner electrode and said outer electrode and communicated with vacuum of said vacuum vessel.

4. A vacuum insulated switching apparatus comprising:

a grounded vacuum vessel, a fixed electrode connected to a main circuit and disposed in said vacuum vessel via an insulator, a movable electrode facing said fixed electrode, connected to said main circuit and disposed in said vacuum vessel via an insulator, and a vacuum pressure measuring terminal which has a portion communicated with a vacuum of said vacuum vessel, measures a pressure of said vacuum vessel with a coaxial electrode, which comprises an inner electrode and an outer electrode surrounding said inner electrode, and a magnetic field generating apparatus arranged around said electrode.

5. A vacuum insulated switching apparatus as claimed in claim 3, wherein an arc shield is provided around said fixed and movable electrodes arranged in said vacuum vessel, and wherein said coaxial electrode is provided at a position of the wall of said vacuum vessel, said coaxial electrode and arc shield being separated from each other.

6. A vacuum insulated switching apparatus as claimed in claim 3, wherein there is provided a shielding means for preventing metallic particles, electrons or ions from entering into said portion between said inner electrode and said outer electrode upon switching said fixed and movable electrodes.

7. A vacuum insulated switching apparatus as claimed in claim 3, wherein said vacuum measuring terminal has an electrode for preventing electrons from entering said vacuum vessel, which has the same potential as that of said outer electrode.

8. A vacuum insulated switching apparatus as claimed in claim 3, wherein said coaxial electrode comprises a cup shaped ceramic cylinder having a recess and said inner electrode penetrating through said ceramic cylinder, the surface of said recess being plated with metal.

9. A vacuum insulated switching apparatus as claimed in claim 3, wherein a protrusion for enhancing electric field of said coaxial electrode is formed to said inner electrode of said coaxial electrode.

10. A vacuum insulated switching apparatus as claimed in claim 3, wherein a megohmmeter is used as an electric power source of said vacuum pressure measuring apparatus.

11. A vacuum insulated switching apparatus as claimed in claim 3, wherein said vacuum vessel is composed of a magnetic material.

12. A vacuum insulated switching apparatus comprising:

a grounded vacuum vessel, a fixed electrode connected to a main circuit, a movable electrode connected to said main circuit, and a vacuum pressure measuring apparatus comprising a coaxial electrode having a portion communicated with a vacuum of said vacuum vessel, a magnetic field generating apparatus for applying a magnetic field to said coaxial electrode and a power source for applying a voltage to said measuring apparatus, a terminal of said measuring apparatus being driven by said power source.

13. A vacuum insulated switching apparatus comprising:

a grounded vacuum vessel, a fixed electrode, a movable electrode, and a vacuum pressure measuring apparatus comprising a coaxial electrode having a portion in communication with a vacuum of said vacuum vessel, a magnetic field generating apparatus for applying a magnetic field to said coaxial electrode, wherein a terminal of said measuring apparatus is connected to a power source for driving said coaxial electrode, when said fixed electrode and said movable electrode are electrically connected to a main circuit.

14. A vacuum insulated switching apparatus comprising:

a grounded vacuum vessel, a fixed electrode, a movable electrode, and a vacuum pressure measuring apparatus comprising a coaxial electrode having a portion in communication with a vacuum of said vacuum vessel, a magnetic field generating apparatus for applying a magnetic field to said coaxial electrode, wherein a terminal of said measuring apparatus is electrically connected to a megohmmeter, when said fixed electrode and said movable electrode are electrically connected to a main circuit.

* * * * *